United States Patent [19]

Gretter

[11] Patent Number: 4,882,686
[45] Date of Patent: Nov. 21, 1989

[54] PRINTING APPARATUS WITH IMPROVED DATA FORMATTING CIRCUITRY

[75] Inventor: Steven R. Gretter, Rochester, N.Y.
[73] Assignee: Eastman Kodak Company, Rochester, N.Y.
[21] Appl. No.: 64,739
[22] Filed: Jun. 22, 1987
[51] Int. Cl.$^4$ ............................................. G06F 3/14
[52] U.S. Cl. .................................... 364/518; 364/519; 340/747
[58] Field of Search ................ 364/518, 519; 340/747, 340/750, 703, 721

[56] References Cited

U.S. PATENT DOCUMENTS

| | | | |
|---|---|---|---|
| 3,832,488 | 8/1974 | Fahey et al. | 178/15 |
| 4,198,680 | 4/1980 | Gray, Jr. | 364/518 |
| 4,280,186 | 7/1981 | Hidai et al. | 364/518 |
| 4,280,763 | 7/1981 | Arai et al. | 355/14 R |
| 4,369,504 | 1/1983 | Hanmura | 365/238 |
| 4,455,578 | 6/1984 | Fearnside . | |
| 4,609,927 | 9/1986 | Yoshida . | |
| 4,695,967 | 9/1987 | Kodama et al. | 364/521 |
| 4,727,423 | 2/1988 | Kaneko et al. | 358/160 |
| 4,729,987 | 2/1988 | Cates | 365/220 |
| 4,734,714 | 3/1988 | Takasu et al. | 346/107 R |
| 4,737,922 | 4/1988 | Ogasawara et al. | 364/519 |
| 4,745,576 | 5/1988 | Hasegawa et al. | 364/900 |
| 4,769,648 | 9/1988 | Kishino et al. | 364/519 X |

FOREIGN PATENT DOCUMENTS

WO86/02045 4/1986 European Pat. Off. .

Primary Examiner—Gary V. Harkcom
Assistant Examiner—Phu K. Nguyen
Attorney, Agent, or Firm—Mark Z. Dudley

[57] ABSTRACT

An image recording apparatus with circuitry for formatting image signals to a print head. The circuitry includes an integrated circuit memory chip having sufficient buffer memory sites for storing either a full line of image signals to be printed or image signals sufficient for filling more than one shift register assemblage associated with the recording element driver. Rasterized image signals are fed to the memory chip in consecutive sequential order. A print head includes a plurality of recording elements such as LED's arranged in a line configuration. The driver actuates the recording elements for recording on a line by line basis. Intermediate registers output the image signals in parallel to each of the shift register assemblages. Image signals are read from the memory chip to the intermediate register in a non-consecutive sequential order. The control for writing data into and reading data from the memory comprises a counter and several flip-flop registers which together provide addresses to locations in the memory chip.

15 Claims, 9 Drawing Sheets

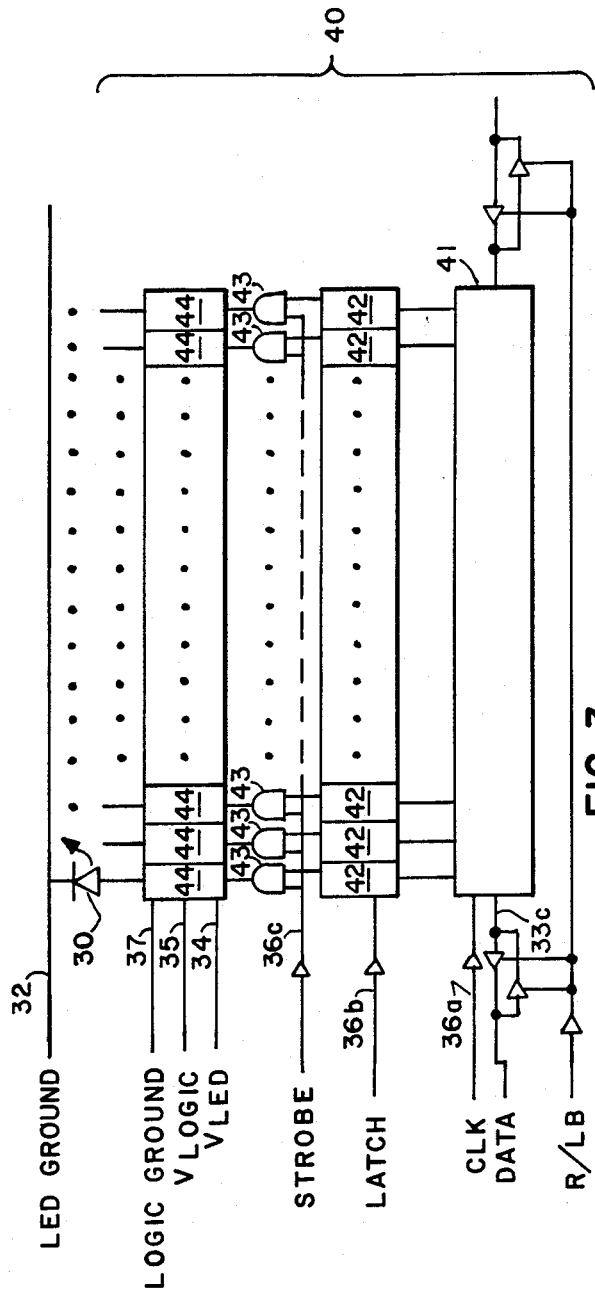
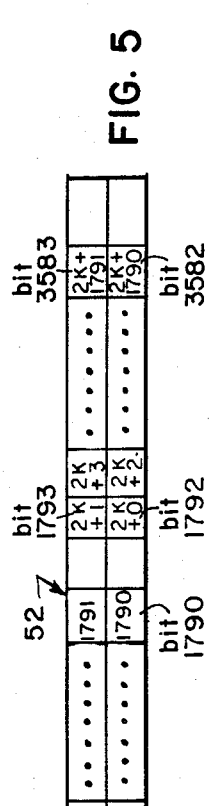
FIG. 3
PRIOR ART
FIG. 5

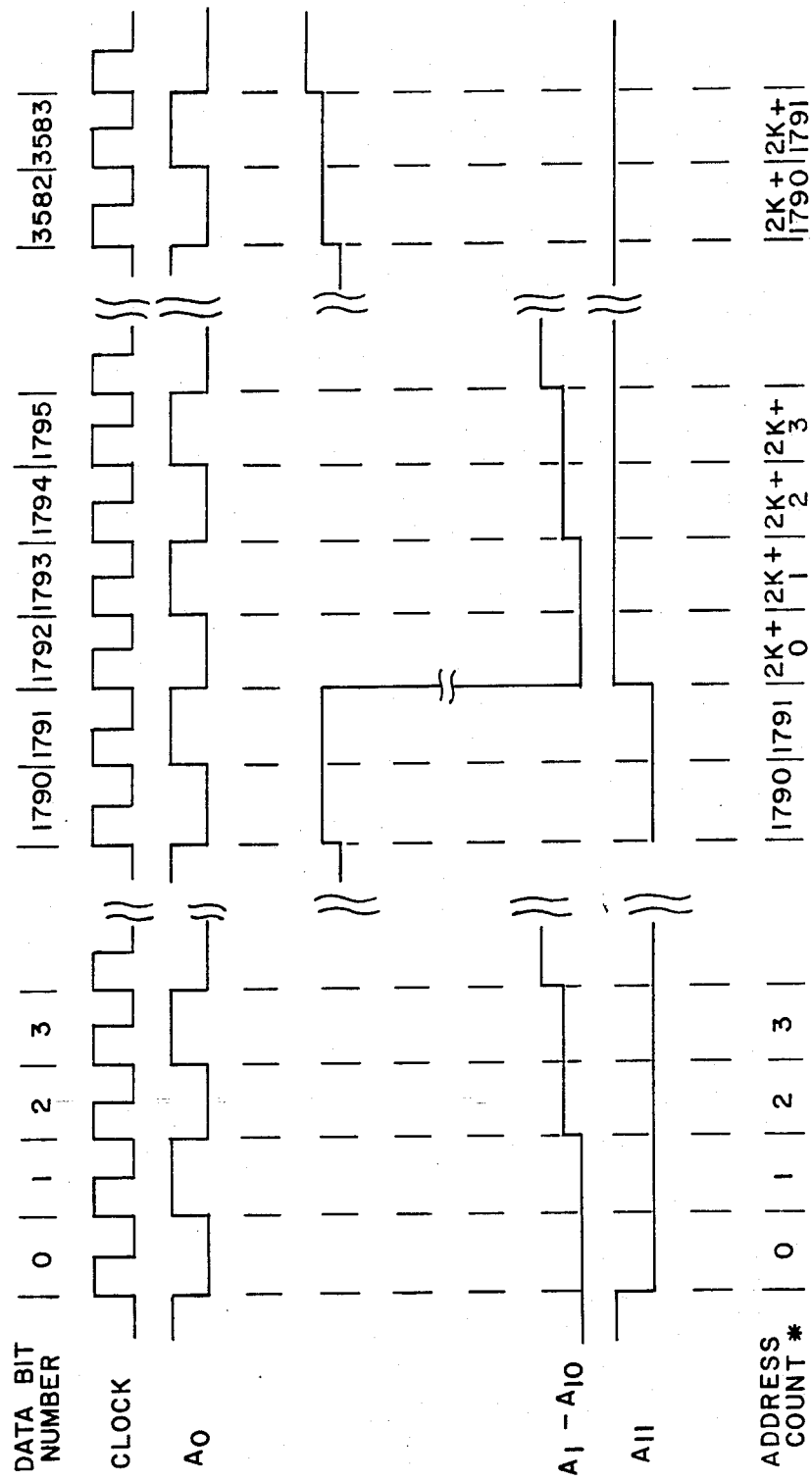

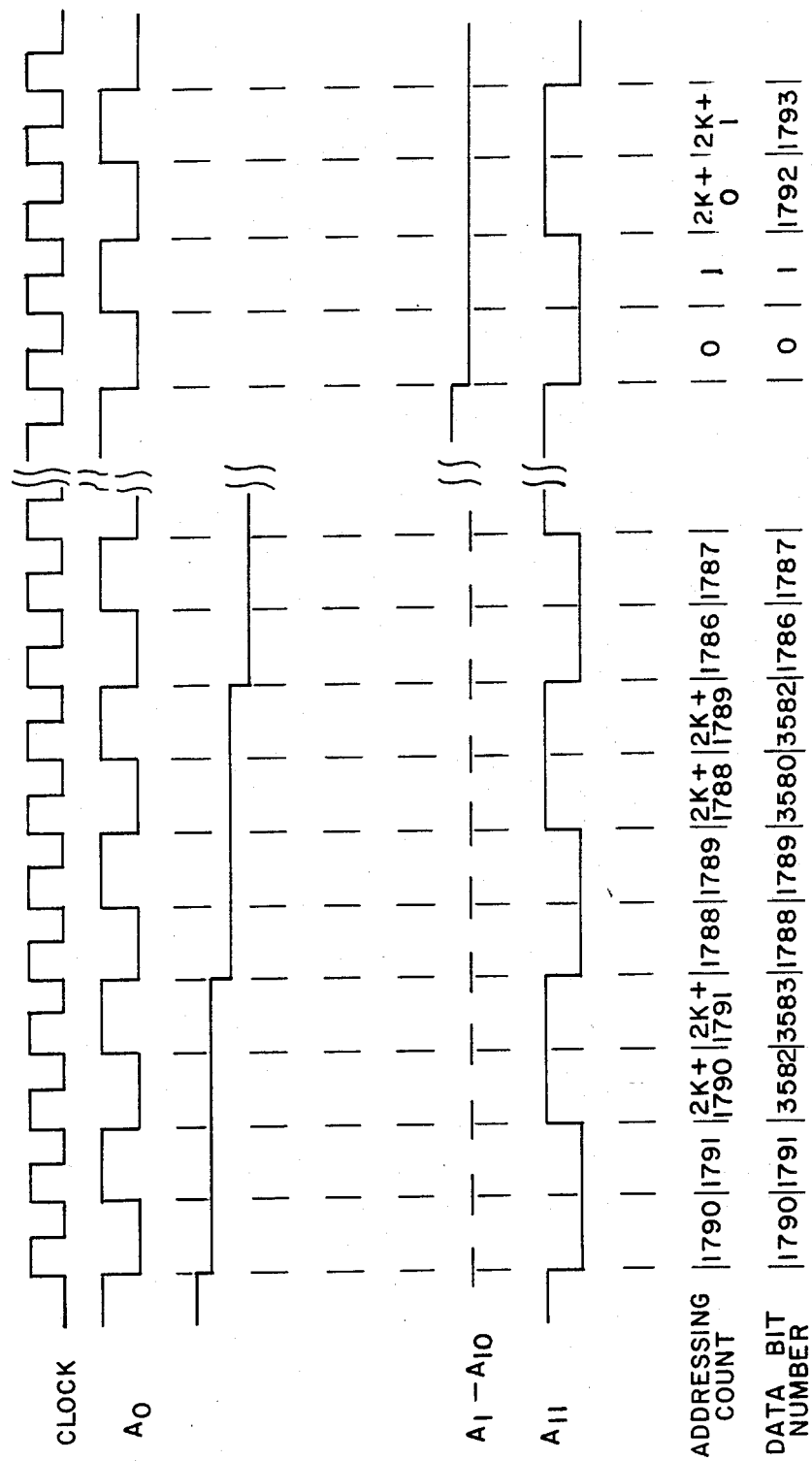

PRINTING APPARATUS WITH IMPROVED DATA FORMATTING CIRCUITRY

BACKGROUND OF THE INVENTION

1. Field of the Invention

The present invention relates to non-impact printing apparatus for recording on a moving recording medium.

2. Brief Description of the Prior Art

In the prior art as exemplified by U.S. patent application Ser. No. 132,638, filed Dec. 9, 1987, which is a continuation of U.S. patent application Ser. No. 033,550, filed Apr. 1, 1987, both now abandoned, printing apparatus is described which comprises a multiplicity of individually addressable and energizable point-like radiation sources, such as light-emitting diodes (LED's), arranged in a row(s) for exposing points upon a photoreceptor during movement thereof relative to and in a direction normal to the row(s). Driver circuits are provided for simultaneously energizing the radiation sources responsive to respective data bit input signals applied to the driver circuits during an information line period. The print or recording head includes a support upon which are mounted chips placed end to end and upon each of which are located a group of LED's. The driver circuits are incorporated in other chips located to each side of the linear array of LED chips. The driver circuits in this apparatus each include a shift register for serially receiving data-bit signals and for driving respective LED's in accordance with the data or image signals.

The shift registers on adjacent chips are coupled together to function as a single "shift register assemblage" so that the data bits (image signals) flow down and fill the shift registers in the shift register assemblage bit by bit under clock control. As driver chips are provided to both sides of the LED's and the drive circuitry to the LED's is alternately interleaved, data must be provided to the shift registers located to one side of the LED's, as appropriate for the odd-numbered LED's, and similarly to the shift registers on the other side the data is provided to the shift registers controlling the even-numbered LED's.

In order to speed up the flow of data to the shift registers it is known not only to feed the odd and even data bits simultaneously to respective shift register assemblages, but to also divide the feeding of data to two shift register assemblages on the same side of the LED's so that while data is being shifted down one set of shift registers of say the odd bits, additional odd bits of data simultaneously are being shifted down other shift register assemblages.

The data management for this type of apparatus may be complex or simple depending upon the arrangement of the data. Where the data is outputted by a raster image processor (RIP) that is suited for use with a laser beam, data management for distributing this data for use with a multiple array print head may present those difficulties. This is due to the consecutive sequential order in which data is provided for a laser exposure device that employs, say, a rotating polygon to expose a line in the mainscanning direction, first pixel first, and so on until the last pixel on that line is exposed. As used herein, the term "consecutive sequential order" refers to an order of data that is congruous with the order of the data as it is to appear on the recording medium.

Data management is made particularly difficult where it is desired to provide a single buffer memory chip for storing a single line of data prior to feeding this data to the shift registers on the print head.

It is, therefore, an object of the invention to provide printer apparatus with improved circuitry for formatting data.

SUMMARY OF THE INVENTION

An image recording apparatus is provided with a memory means includes an integrated circuit memory chip having sufficient buffer memory sites for storing either a full line of image signals to be printed or image signals sufficient for filling more than one shift register assemblage associated with the recording element driving means; means provides serially the image signals to said first memory means in consecutive sequential order; recording means includes a plurality of recording elements and driver means for activating said elements for recording an image on a recording material on a line by line basis; a plural number of shift register assemblages output the image signals in parallel to the driver means; intermediate register means outputs the image signals to each of the shift register assemblages; and extracting means extracts the image signals from the memory means to the intermediate register means.

BRIEF DESCRIPTION OF THE DRAWINGS

FIG. 3 is a block diagram of a prior art driver circuit for use in the print head of FIG. 2;

FIG. 5 is a schematic illustrating data storage in a memory device forming part of the circuit shown in FIG. 4;

FIGS. 6a and 6b are waveform diagrams illustrating operation of the circuit shown in FIG. 4.

DESCRIPTION OF THE PREFERRED EMBODIMENTS

The apparatus of the preferred embodiment will be described in accordance with an electrophotographic recording medium. The invention, however, is not limited to apparatus for creating images on such a medium, as other media such as photographic film etc. may also be used within the spirit of the invention.

Because electrophotographic reproduction apparatus are well known, the present description will be directed in particular to elements forming part of or cooperating more directly with the present invention. Apparatus not specifically shown or described herein are selectable from those known in the prior art.

Figure 1:
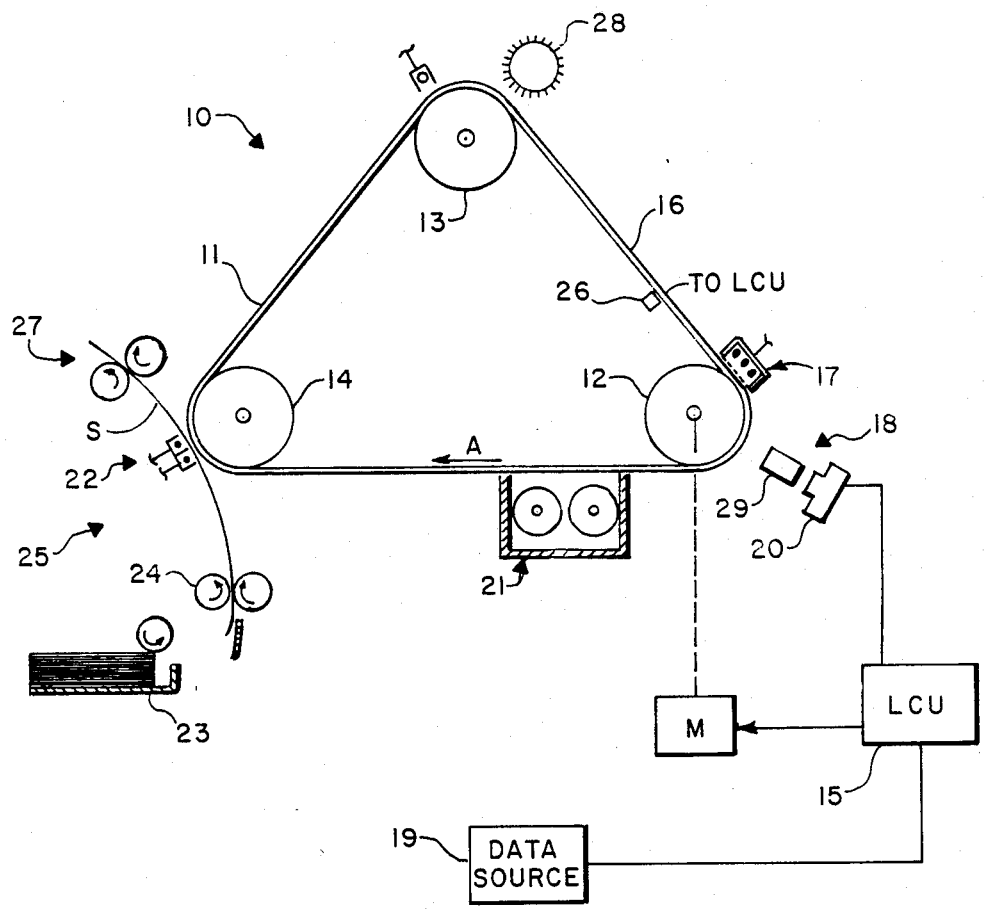
FIG. 1 is a schematic of a printing apparatus of the prior art.

With reference now to FIG. 1, an electrophotographic reproduction apparatus 10 includes a recording medium such as a photoconductive web 11 or other photosensitive medium that is trained about three transport rollers 12, 13 and 14, thereby forming an endless or continuous web. Roller 12 is coupled to a driver motor M in a conventional manner. Motor M is connected to a source of potential when a switch (not shown) is closed by a logic and control unit (LCU) 15. When the switch is closed, the roller 12 is driven by the motor M and moves the web 11 in clockwise direction as indicated by arrow A. This movement causes successive image areas of web 11 to sequentially pass a series of electrophotographic work stations of the reproduction apparatus.

For the purposes of the instant disclosure, several work stations are shown along the web's path. These stations will be briefly described.

First, a charging station 17 is provided at which the photoconductive surface 16 of the web 11 is sensitized by applying to such surface a uniform electrostatic primary charge of a predetermined voltage. The output of the charger may be controlled by a grid connected to a programmable power supply (not shown). The supply is in turn controlled by the LCU 15 to adjust the voltage level Vo applied onto the surface 16 by the charger 17.

At an exposure station 18 an electrostatic image is formed by modulating the primary charge on an image area of the surface 16 with selective energization of point-like radiation sources in accordance with signals provided by a data source 19 such as a computer. The point-like radiation sources are supported in a print head 20 to be described in more detail below.

A development station 21 includes developer which may consist of iron carrier particles and electroscopic toner particles with an electrostatic charge opposite to that of the latent electrostatic image. Developer is brushed over the photoconductive surface 16 of the web 11 and toner particles adhere to the latent electrostatic image to form a visible toner particle, transferable image. The development station may be of the magnetic brush type with one or two rollers. Alternatively, the toner particles may have a charge of the same polarity as that of the latent electrostatic image and develop the image in accordance with known reversal development techniques.

The apparatus 10 also includes a transfer station 25 shown with a corona charger 22 at which the toner image on web 11 is transferred to a copy sheet S; and a cleaning station 28, at which the photoconductive surface 16 of the web 11 is cleaned of any residual toner particles remaining after the toner images have been transferred. After the transfer of the unfixed toner images to a copy sheet S, such sheet is transported to a heated pressure roller fuser 27 where the image is fixed to the copy sheet S.

As shown in FIG. 1, a copy sheet S is fed from a supply 23 to driver rollers 24, which then urge the sheet to move forward onto the web 11 in alignment with a toner image at the transfer station 25.

To coordinate operation of the various work stations 17, 18, 21 and 25 with movement of the image areas on the web 11 past these stations, the web has a plurality of indicia such as perforations along one of its edges. These perforations generally are spaced equidistantly along the edge of the web 11. At a fixed location along the path of web movement, there is provided suitable means 26 for sensing web perforations. This sensing produces input signals into the LCU 15 which has a digital computer, preferably a microprocessor. The microprocessor has a stored program responsive to the input signals for sequentially actuating, then de-actuating the work stations as well as for controlling the operation of many other machine functions. Additional or other encoding means may be provided as known in the art for providing the precise timing signals for control of the various functions of the apparatus 10.

Programming of a number of commercially available microprocessors is a conventional skill well understood in the art. This disclosure is written to enable a programmer having ordinary skill in the art to produce an appropriate control program for the one or more microprocessors used in this apparatus. The particular details of any such program would, of course, depend on the architecture of the designated microprocessor.

Figure 2:
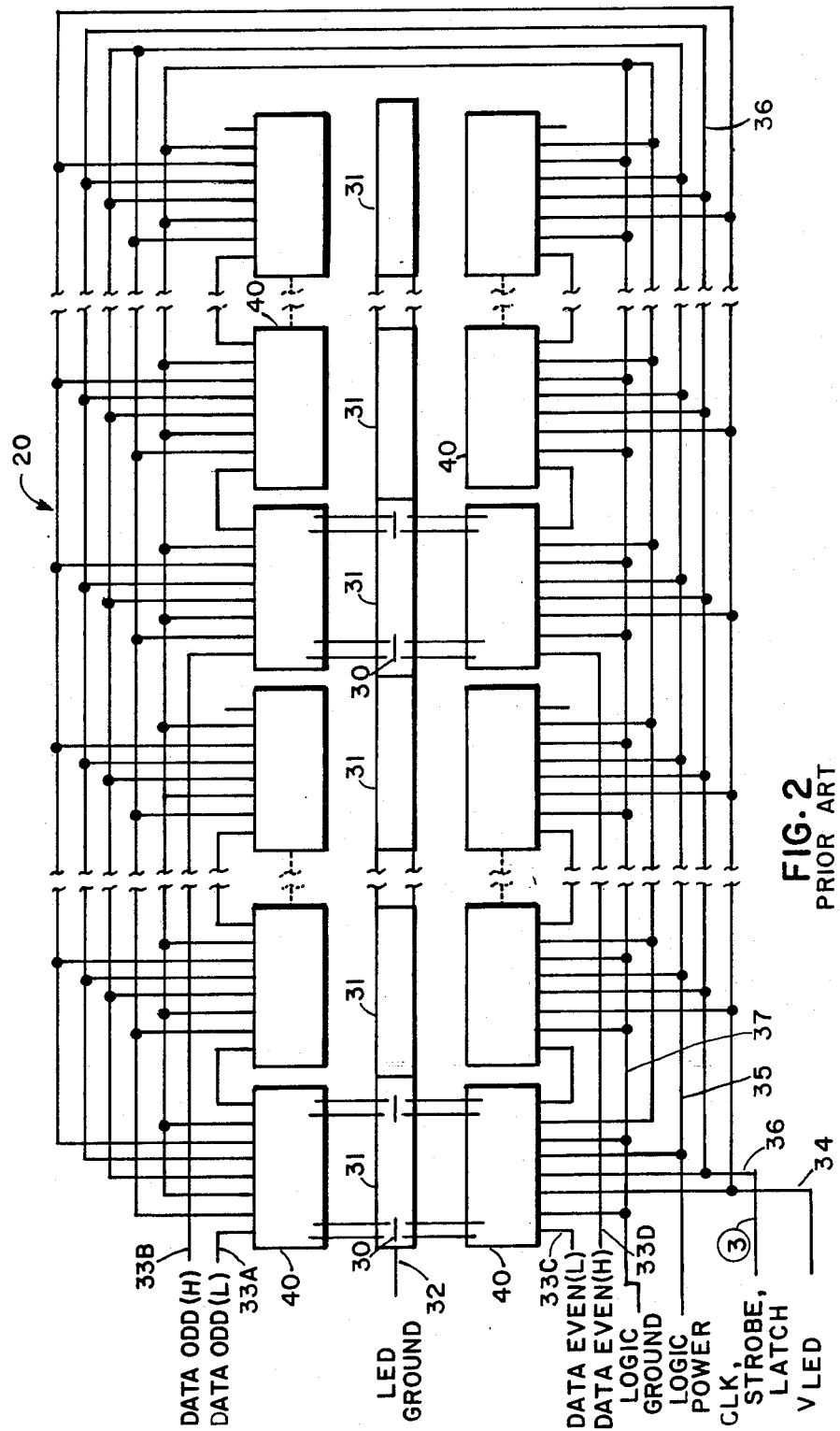
FIG. 2 is a block diagram of circuitry used in forming a print head of the apparatus of FIG. 1 in accordance with the prior art.

With reference to FIGS. 1 and 2, the print head 20, as noted, is provided with a multiplicity of energizable point-like radiation sources 30, preferably light-emitting diodes (LED's) although other recording devices such as thermal devices, liquid crystal display elements or needle electrodes are also contemplated. Optical means 29 may be provided for focusing light from each of the LED's onto the photoconductive surface. The optical means preferably comprises an array of optical fibers such as sold under the name Selfoc, a trademark for a gradient index lens array sold by Nippon Sheet Glass, Limited. Due to the focusing power of the optical means 29, a row of emitters will be imaged on a respective transverse line on the recording medium.

With reference to FIG. 2, the print head 20 comprises a suitable support with a series of LED chips 31 mounted thereon. Each of the chips 31 includes in this example 64 LED's arranged in a single row. Chips 31 are also arranged end-to-end in a row and where fifty-six LED chips are so arranged, the print head will extend across the width of the web 11 and include 3584 LED's arranged in a single row. To each side of this row of LED's there are provided fifty-six identical driver chips 40. Each of these driver chips include circuitry for addressing the logic associated with each of 32 LED's to control whether or not an LED should be energized or activated. Two driver chips 40 are thus associated with each chip of 64 LED's. Each of the two driver chips will be coupled for driving of alternate LED's. Thus, one driver chip will drive the odd numbered LED's of the 64 LED's and the other will drive the even numbered LED's of these 64 LED's. The driver chips 40 are electrically connected in parallel to a plurality of lines 34–37 providing various electrical control signals and potentials. Lines 34 and 35 provide electrical energy for operating the various logic devices and current drivers in accordance with their voltage requirements. Lines 32 and 37 provide ground or return lines for lines 34 and 35, respectively. A series of lines, 36a, b and c provide clock signals and other pulses for controlling the movement of data to the LED's in accordance with known techniques. Data lines 33A, 33B, 33C and 33D are also provided for providing digital data or image signals in the form of either a high or low logic lelvel. The driver chips each include a data-in and data-out port so that data is serially passed between appropriate chips. Driver chips having respective shift registers linked together as such comprise a "shift register assemblage."

The driver chips receiving the data for the odd numbered LED's are divided into two shift register assemblage groups. The first group of shift register assemblages receive data serially through line 33A. The second group of driver chips receive data through line 33B. Similarly, the driver chips receiving the data for the even-numbered LED's are divided into two shift register assemblage groups and receive data over lines 33C, 33D, respectively.

With reference now to FIG. 3, the architecture for each driver chip 40 includes a 32 bit bi-directional shift register 41. A logic signal carried over line R/LB determines the direction data will flow down this register. Assume that this chip is enabled to cause data to flow down the register from left to right as shown in FIG. 3. Data thus enters shift register 41 over line 33C through the driver chip's data-in port at the left from say the data-out port of a driver chip immediately to the left or from the LCU if the driver chip 40 is the first chip for data to enter. Data exits from this chip at the data-out port to be input to the next adjacent driver chip to the right of driver chip 40. In operation, for each line of image to be exposed in the main scanning direction, i.e., transverse to that of movement of the recording medium 11, suitably rasterized data from the data source streams serially through each of the four shift register assemblages under control of clock pulses provided by the LCU over line 36a. When 3584 bits of data (1's or 0's) are stored by the shift registers of all of the driver chips, a latch signal is provided over line 36b to latch this data into latch registers 42 so that the shift registers 41 may commence filling with data signals for the next line of exposure. Thirty-two latch registers 42 are provided in each driver chip to receive the data transferred in parallel fashion from the shift register 41. Each latch register is associated with a particular LED and adjacent latch registers are associated with every other LED. A logic AND gate 43 is associated with each latch register and has one input coupled to the output of its respective latch register and its other input coupled to a line 36c for providing a strobe or timing pulse from the LCU. This strobe pulse determines when to trigger the LED's to turn on in relation to the position of the recording medium and the duration for which the LED's are turned on. All the AND gates have one of their inputs connected to this strobe line. The output of each of the AND gates is coupled to a logic circuit that is part of a constant current driver circuit 44. Leads to the constant current driver circuit include voltage supply and ground lines (35 and 37, respectively) to the logic devices therein as well as separate voltage and return lines (34 and 32, respectively) for providing current to the LED's. Alternatively, several strobe signals of varying durations may be used to control the "on" times of the LED's in accordance with time durations designed to provide uniform light output on the average for the subgroups of LED's on each chip.

Figure 4:
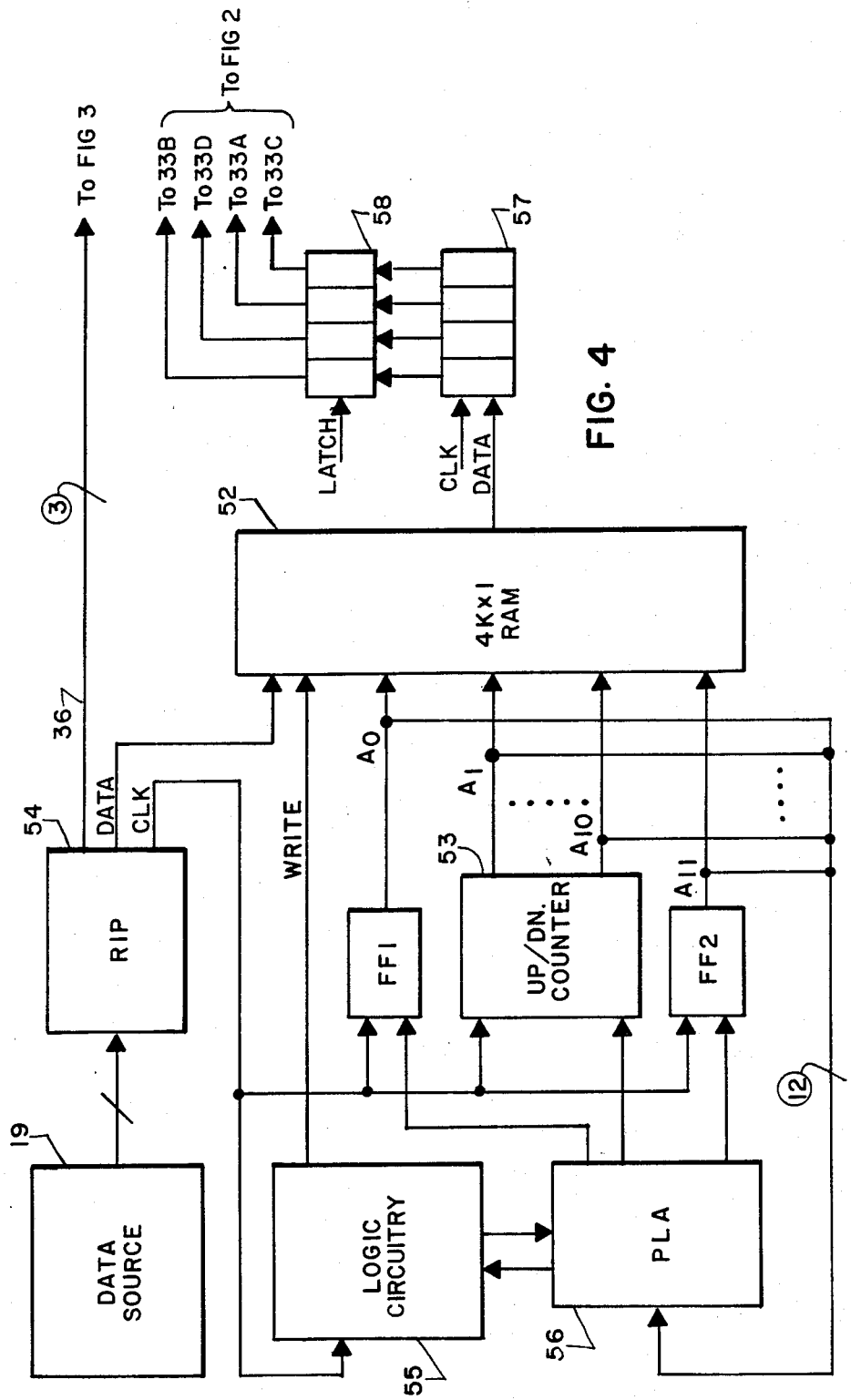
FIG. 4 is a schematic of an improved circuit for formatting data to the driver circuit of FIG. 2 in accordance with the invention.
Figure 7A:
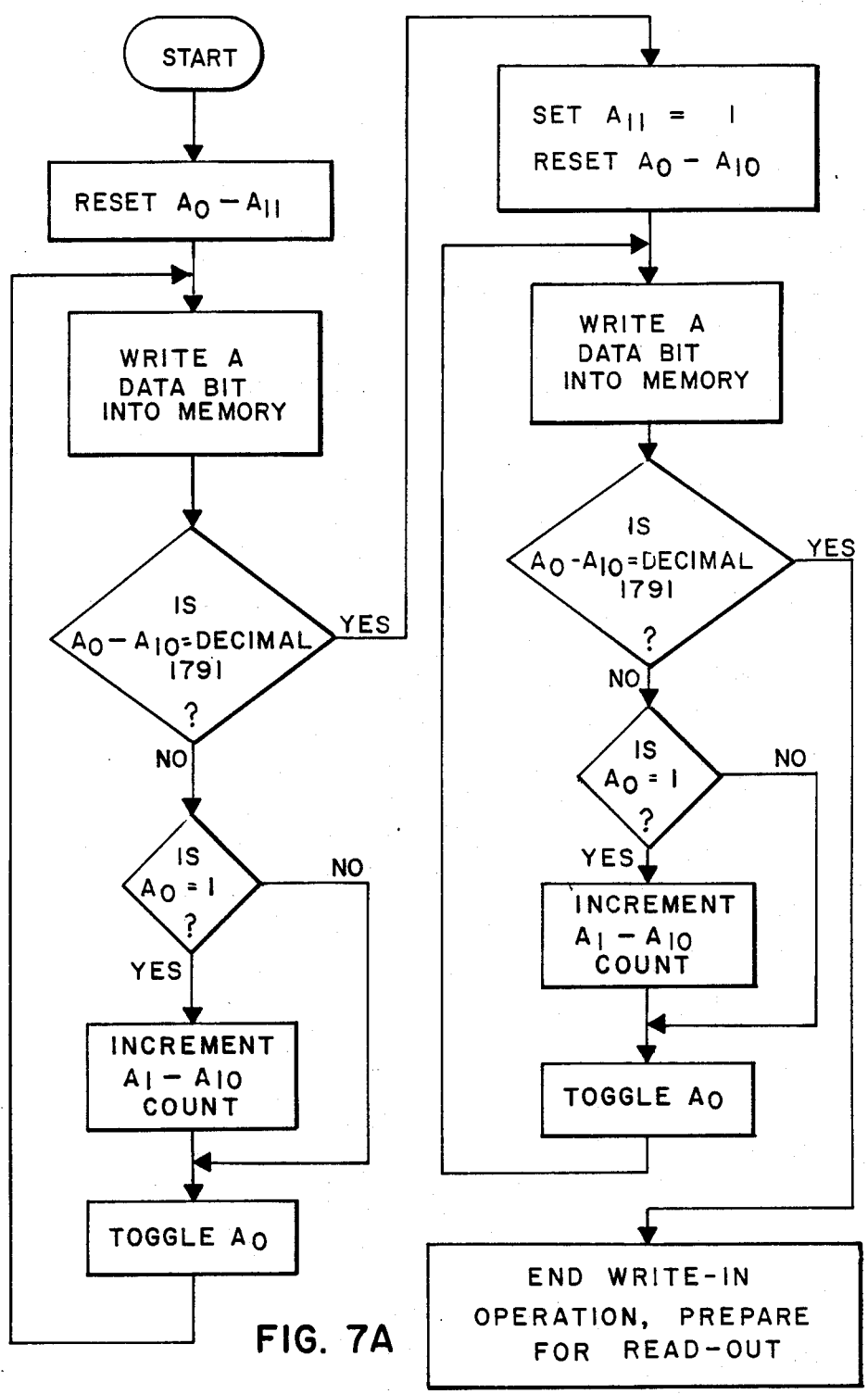
FIGS. 7a and 7b are flow charts illustrating a program of operation of the circuit in FIG. 4.
Figure 7B:
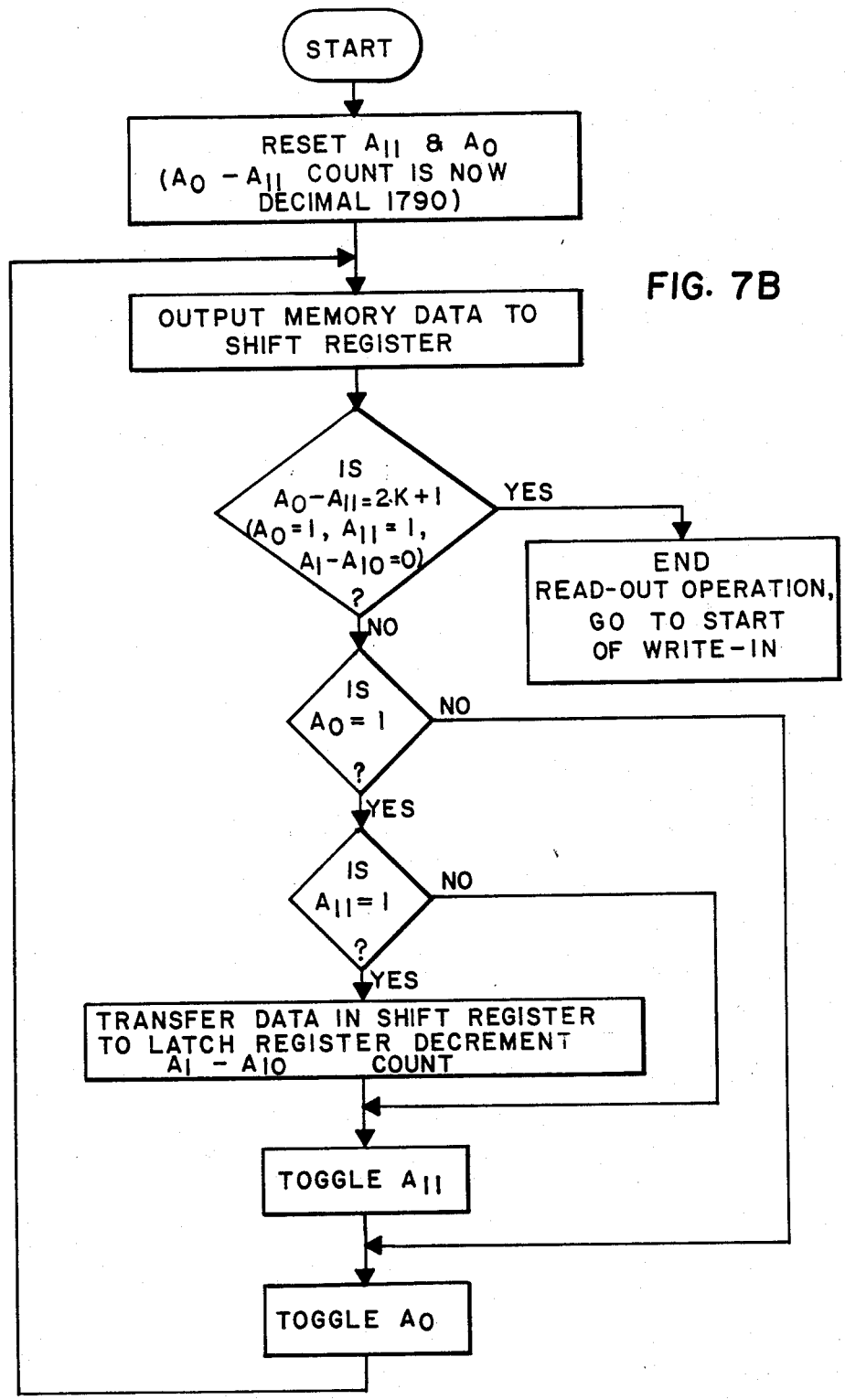

With reference now to FIGS. 4 and 5, the circuitry forming a part of the LCU 15 for formatting the flow of data to the driver chips on the print head will now be described. Description for operation of storing one line of data will now be made, it being understood that additional duplicate circuitry or circuits providing an equivalent of such duplicate circuitry is also provided for operating upon a second line of data. Thus, while one line of data is being stored in the circuitry shown in FIG. 4, the other line of data is being sent to the shift register assemblages on print head 20 by the circuitry not shown and when the next line of data is to be sent to the print head from the circuitry shown, the next following line of data is stored in the circuitry not shown.

Recall that there are 3584 bits of data or image signals to be stored for each line. Data is generated by a data source 19 such as a computer or document image scanner and provided as a bit stream or rasterized data by RIP 54. The rasterized data as noted above is in consecutive sequential order. The smallest single memory device generally available for storing this many bits is a 4K×1 static RAM (random access memory) device 52 which contains 4096 memory sites. Thus, the 3584 bits of memory must be stored in this device yet read out in an order that allows a latch register 58 to simultaneously feed a first set of four bits comprising data bits (1790, 1791, 3582, 3583); then the next set of four data bits (1788, 1789, 3580, 3581); then the next set of four data bits (1786, 1787, 3578, 3579) and so on until the last set of bits (0, 1, 1792, 1793) is sent to the shift register assemblages on the print head. This requirement is due to the use of odd and even driver chips and of grouping both the odd and even driver chips further into low and high numbered LED driver chips.

In order to accomplish this with relatively inexpensive circuitry, the apparatus of the invention includes an up/down counter 53 (which may be plural ganged integrated circuit counters), a first flip-flop register (FF$_1$) and a second flip-flop register (FF$_2$). FF$_1$, counter 53, and FF$_2$ have outputs denoted in FIG. 4 as A$_o$, A$_1$ through A$_{10}$, and A$_{11}$, respectively. These outputs are input to RAM 52 to designate addresses for memory locations in RAM 52, and are also input to a programmable logic array (PLA) 56. The PLA in turn has outputs which, together with outputs from additional logic circuitry 55, determine the synchronous state changes of FF$_1$, FF$_2$, and counter 53. The design of the PLA and logic circuitry may be easily realized, as will be apparent to one of ordinary skill in the art after reading the specification herein. RAM 52 receives serial data from a raster image processor (RIP) 54, which also may provide a clock signal that is synchronized with the data bits. The clock, for example, may be 15 MHz. As noted above, the RIP is delivering the data bits for this line of print in consecutive sequential order such that the first bit represents the "0" numbered pixel at the beginning of a line in the main scanning direction and the last bit represents data for the 3583rd numbered pixel at the end of the line.

With reference also to FIG. 6A, a cycle of operation starts with the rising edge of the first clock pulse, which triggers reset of FF$_1$, FF$_2$, and all counter outputs to logic "0" so that they "point to" or address memory location "0" in RAM 52. Upon the falling edge of this clock pulse, the data bit associated therewith is written into location "0" by application of a write pulse from logic circuitry 55 to RAM 52. With the next clock pulse the output of FF$_1$ is set to logic level "1", but the counter output and output of FF$_2$ remain logic "0" through inhibit signals provided by PLA 56. Thus, the bit of data associated with this clock pulse is entered into memory location "1" of RAM 52. As can be seen, the output A$_o$ from FF$_1$ controls whether the bit is odd or even. On the next clock pulse the counter is not inhibited and increments to an output of "1". As the output on line A$_o$ is now logic "0", the RAM "sees" this as identifying memory location "2" since A$_o$ represents the least significant bit for addressing memory locations in RAM 52, while A$_1$ from the counter 53 represents the next to the least significant bit. The outputs of A$_o$ through A$_{11}$ represent in the order shown a binary address number. The above procedure for storage of data in odd and even memory locations continues until a count of 1791 is represented by the output of the counter 53 including A$_o$ as the least significant bit. At this point, the PLA 56 removes the inhibit on FF$_2$ and on the next clock pulse causes reset of the counter outputs A$_1$ through A$_{10}$ and output A$_o$ from FF$_1$ to "0".

Thus $A_{11}$ only is logic "1" and the memory location addressed in RAM 52 is 2048 (or more conveniently, denoted as 2K. Note $A_{11}$ represents the most significant bit of the counter and $2^{11}$=decimal 2048). A data bit is then written into location 2K, and the process continues. The next 1791 bits of data are written into locations 2K+1, etc. up to 2K+1791. $A_o$ has changed during each clock pulse so that the odd and even bits are suitably located in the higher numbered memory locations or RAM 52. When the counter output reaches 2K+1791 for the last bit of the line the PLA may inhibit the counting of clock pulses by the counter or as shown inhibited after reaching 2K+1792. The data writing portion of the cycle of writing data or image signals into RAM 52 is complete at this point.

In the data reading portion of the cycle of operation, the logic circuitry 55 causes the counter 53 to count down instead of up, and the PLA 56 inhibits $F_2$, and the counter in a way that produces a different address sequence than was used for data writing. Write pulses are not applied to the RAM, and data read from the RAM is input to a 4-bit serial shift register 57 forming with a latch register 58 an intermediate register means between RAM 52 and the shift register assemblages. Note that the data is written into and read out from the RAM at the same high clock speed simplifying the circuitry acting upon RAM 52. Prior to initiating reading of data out from RAM 52, several clock cycles occur to allow data from the previous line to be read out of register 58. The data for the previous line has been formatted using, as noted above, similar circuitry to that described but shares the intermediate register with the formatting circuitry shown. At the first clock pulse for reading data, both $A_o$ and $A_{11}$ are reset to logic "0" and the output of the counter is allowed to decrement by one, returning $A_1$ through $A_{10}$ to the values they had when last used for writing data, so the memory address is now only 1790. The data bit stored in location 1790 is now output to the shift register 57 which is also under clock control. On the next clock pulse, output line $A_o$ of $FF_1$ switches to logic "1" and the address identified by the address lines $A_o$ through $A_{11}$ is 1791. The data bit stored in this location is now output to the shift register. Upon the next clock pulse $A_o$ goes to logic "0" and $A_{11}$ to logic "1" (since in the read-out mode of the RAM the PLA is programmed to cause $FF_2$ to change state on every second clock pulse), so the data bit in location 2K+1790 is output to the shift register. Upon the next clock pulse $A_o$ is logic "1", $A_{11}$ is logic "1" and memory location 2K +1791 is thus addressed. With the next clock pulse, the PLA removes the inhibition on the counter, allowing it to decrement by one, and the count output of the counter including $A_o$ then points to memory location 1788 (both $A_o$ and $A_{11}$ are 0). Note that as read-out from the RAM 52 continues, the counter 53 is inhibited by the PLA for three of every four clock cycles. In the meanwhile, the data in the 4-bit register 57 is shifted out in parallel fashion to a latch register 58 in response to a latch signal that corresponds to every fourth clock pulse. Thus, because the counter 53 is inhibited so that it decrements every fourth clock pulses, it allows the shifting into the serial register 57 of the data bits remaining in the 4 highest memory locations of quadrants which can be identified as even number—lower level; odd number—lower level; even number—higher level; odd number—higher level.

The bits in turn shifted by four from the latch register 58 are distributed to the proper shift registers on the print head. Thus, data is transferred to the print head at the same high data rate that is output from the RIP, even though the shift registers on the print head have a shifting speed of only one fourth of the RIP's clock.

Thus, a serial stream of data bits representing in consecutive sequential order a data bit stream of pixels 0 through 3583 is reformatted by relatively inexpensive circuitry and output to the print head in groups of four data bits representing bits (1790, 1791, 3582, 3583); (1788, 1789, 3580, 3581); (1786, 1787, 3578, 3579) - - - - (0, 1, 1792, 1793).

The address control circuitry described herein for addressing a line buffer memory, comprising several flip-flops, counter integrated circuits, logic devices and a programmable logic array may be considered a synchronous state machine. The state machine produces memory address signals in a different sequence for readout of data than for write-in. The basic concepts described herein could be used to design circuits to reorganize serial data for a print head with virtually any number, length and arrangement of shift register assemblages. While the invention has been described with the use of one memory chip for storing a full line of data or image signals, it will be understood that several memory chips together may be used to store one line of data of, say, M bits so long as the number N of memory chips is fewer than the number of shift register assemblages to which the memory chips distribute data.

The invention has been described in detail with particular reference to preferred embodiments thereof, but it will be understood that variations and modifications can be effected within the spirit and scope of the invention.

I claim:

1. An image recording apparatus comprising:
   memory means, including one or more, but less than a first predetermined plural number, N, of integrated circuit memory chips, having at least a second plural predetermined number, M, of memory sites for storing in said chip(s) as a buffer memory image signals representing a full line of image signals to be printed by said apparatus;
   means for writing serially the image signals to said memory means in consecutive sequential order;
   recording means having said second predetermined number of recording elements and driver means for activating same for recording an image on a recording material on a line by line basis;
   shift register assemblage means having the first predetermined number of shift register assemblages, each for storing image signals that are serially inputted into each shift register assemblage and for outputting said image signals in parallel to said driver means;
   intermediate register means for shifting image signals to each of said shift register assemblages; and
   extracting means for extracting from said memory means image signals and for feeding said image signals to said intermediate register means.

2. The apparatus of claim 1 and wherein the extracting means further comprises means for serially outputting image signals from said memory means in non-consecutive sequential order.

3. The apparatus of claim 2 and wherein the extracting means outputs the image signals from said memory means for a particular shift register assemblage only once for every N consecutive bits of signals outputted from said memory means.

4. The apparatus of claim 2 and wherein said intermediate register means includes shift register means coupled to said memory means for receiving image signals serially outputted from said memory means in non-consecutive sequential order and latch register means coupled to said shift register means for receiving image signals in parallel from said shift register means.

5. The apparatus of claims 1, 2, or 4 and including means providing clock signals; and counter means responsive to said clock signals for varying the count state of the counter in a predetermined sequence, said counter means having a plurality of output lines indicating the count state of the counter means, said output lines being coupled to said memory means to identify in a predetermined sequence at least portions of the addresses of memory sites in said memory chip.

6. The apparatus of claim 5 and including supplementary address register means responsive to said clock signals and not forming a part of said counter means for completing the remaining portions of the address of said memory sites.

7. The apparatus of claim 6 and wherein the supplementary address register means provides the address portion representing the least significant bit of the address to alternately, with time, identify odd and even addresses.

8. The apparatus of claim 7 and wherein the supplementary address register means provides the address portion representing the most significant bit of the address and the outputs of the address register means determine which of the different shift register assemblages are to receive the respective image signals.

9. The apparatus of claim 8 and further including means for placing the counter means in respective up and down counting modes; and means for inhibiting a change in output on an output line of said supplementary address register means during the count-up mode until the address indicated by the counter and the supplementary address register means corresponds to a bit at the midpoint of the line of image signals.

10. The apparatus of claim 9 and further including means for inhibiting the change of output on said line of said supplementary address register means during the count-down mode except for every second clock pulse.

11. The apparatus of claim 1 and wherein the memory means comprises a single integrated circuit memory chip having at least the second plural predetermined number of memory sites encompassed within said one chip for storing a full line of image signals in said single chip.

12. The apparatus of claims 1 or 11 and including clock means for controlling writing of data into and reading data out of said memory means and wherein the extracting means extracts data from the memory means at the same rate that data is written into the memory means.

13. An image recording apparatus comprising:
memory means including a single integrated circuit memory chip having at least a first plural predetermined number of memory sites for storing in said chip as a buffer memory image signals representing image signals to be stored in more than one shift register assemblage;
means for providing serially the image signals to said first memory means for storage in said memory chip;
recording means having said first predetermined number of recording elements arranged in a line configuration and driver means for activating same for recording an image on a recording material on a line by line basis in accordance with image signals;
means including a second plural predetermined number of shift register assemblages, each for storing image signals that are serially inputted into each shift register assemblage and for outputting said image signals in parallel to said driver means;
intermediate register means for shifting in parallel image signals to each of said shift register assemblages; and
extracting means for extracting from said first memory chip image signals and for feeding said image signals to said intermediate register means for subsequent outputting to said plural predetermined number of shift register assemblages.

14. The apparatus of claim 13 and wherein the extracting means further comprises means for serially outputting image signals from said memory means in non-consecutive sequential order.

15. The apparatus of claim 14 and wherein said intermediate register means includes a shift register means coupled to said memory means for receiving image signals serially extracted from said memory means in non-consecutive sequential order, and said shift register being coupled to a latch register means for outputting image signals in parallel to said latch register means.

* * * * *